(12) United States Patent
Tonn

(10) Patent No.: US 11,879,923 B1
(45) Date of Patent: Jan. 23, 2024

(54) METHOD FOR ESTIMATING ANTENNA GAIN VIA NEAR-FIELD MEASUREMENTS

(71) Applicant: The United States of America, as represented by the Secretary of the Navy, Newport, RI (US)

(72) Inventor: David A Tonn, Charlestown, RI (US)

(73) Assignee: The Government of the United States of America as represented by the Secretary of the Navy

(*) Notice: Subject to any disclaimer, the term of this patent is extended or adjusted under 35 U.S.C. 154(b) by 296 days.

(21) Appl. No.: 17/488,457

(22) Filed: Sep. 29, 2021

(51) Int. Cl.
  *G01R 29/10* (2006.01)
  *G01R 29/08* (2006.01)

(52) U.S. Cl.
  CPC ..... *G01R 29/0878* (2013.01); *G01R 29/0892* (2013.01)

(58) Field of Classification Search
  CPC ...... H01Q 3/267; H01Q 3/2605; G01R 29/10; G01R 29/12; G01R 29/0821; G01R 29/0878; G01R 29/0892
  See application file for complete search history.

(56) References Cited

U.S. PATENT DOCUMENTS

| | | | | |
|---|---|---|---|---|
| 5,119,105 A | * | 6/1992 | Ngai | G01R 29/10 343/882 |
| 6,285,330 B1 | * | 9/2001 | Perl | G01R 29/10 343/703 |
| 6,288,683 B1 | * | 9/2001 | Deguchi | H01Q 19/191 343/781 CA |
| 10,459,021 B2 | * | 10/2019 | Lee | G01R 29/10 |
| 10,677,831 B2 | * | 6/2020 | Rowell | G01R 31/2822 |
| 11,081,788 B1 | * | 8/2021 | Hahn, III | H04B 17/102 |
| 2012/0306521 A1 | * | 12/2012 | Nickel | H01L 21/00 324/754.03 |
| 2015/0138026 A1 | * | 5/2015 | Shay | H04B 17/12 343/703 |
| 2020/0358177 A1 | * | 11/2020 | Ge | H01Q 3/2611 |

OTHER PUBLICATIONS

Peter R. Bannister, Application of Complex Image Theory, Journal Article, Jul.-Aug. 1986, pp. 605-615, vol. 21, No. 4, Radio Science, USA.

* cited by examiner

*Primary Examiner* — Tung X Le
(74) *Attorney, Agent, or Firm* — James M. Kasischke; Michael P. Stanley; Jeffry C. Severson

(57) ABSTRACT

A method is provided for estimating an antenna gain for an antenna under test (AUT). The AUT is positioned above a lossy surface and a probe antenna is positioned at a test distance from the AUT. A known signal is emitted from the AUT and received at the probe antenna. Utilizing the calculated normalized potential, the AUT gain can be estimated at any distance from the AUT. An apparatus is also provided.

15 Claims, 2 Drawing Sheets

METHOD FOR ESTIMATING ANTENNA GAIN VIA NEAR-FIELD MEASUREMENTS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The invention relates to a method and apparatus for computing the gain of an antenna under test (AUT). This invention further relates to an antenna operating above and in proximity to a half-space interface based on measurements of fields produced by the antenna in a near-field region.

(2) Description of the Related Art

Measurements of the power gain and radiation patterns of antennas are obtained via the use of far-field ranges. In order to operate in the far-field region of an antenna under test (AUT), a source antenna is placed a distance r from the AUT. The distance r is referred to as a baseline distance of the range, and satisfies the following criterion in order for the range to be considered a far-field range:

$$(r \gg \lambda) \wedge (r \gg d) \wedge \left(r > \frac{2d^2}{\lambda}\right) \quad (1)$$

Here, $\lambda$ is a wavelength of an electromagnetic signal emitted by the source antenna in free-space, and d is a largest dimension of the AUT.

In a far-field range, the gain of the AUT may be determined via the gain transfer method, as disclosed in the IEEE standard 149. In the gain transfer method, a source antenna is located on the range in free-space (or in an anechoic chamber) a distance r away from the AUT such that r satisfies the far-field conditions given in (1) above. A signal source is attached to the source antenna, and a receiver such as a spectrum analyzer is attached to the AUT. A signal is transmitted to the receiver from the source, whereby a power level received by the receiver of the AUT is then recorded. The AUT is then replaced with a calibrated gain standard (e.g., relative to an isotropic source), the process is repeated without changing the power level of the signal source, and the power level received by the standard is recorded. The gain level of the AUT is then computed as a function of the calibrated gain standard, the power level received by the receiver of the AUT, and the power level received by the standard.

However, in order for the gain transfer method above to be employed, the range is desired to satisfy the far-field conditions (1), and is assumed to be in free-space. For example, the gain transfer method cannot be employed to accurately calculate the gain of the AUT under near-field conditions. Techniques may be utilized to extrapolate to the far-field region of the AUT from measurements in the near-field region of the AUT, however such methods assume a space free of obstructions. Hence, near-field techniques also cannot be employed accurately in the presence of a lossy half-space boundary. A lossy half-space is one half of three-dimensional space, as defined by a dividing plane, where electromagnetic energy is dissipated. This is typically the air-sea interface, but an air-ground interface could also be a lossy half-space at certain radio frequencies.

Analysis of antennas in the presence of a lossy half-space utilizes complex image theory as taught by P. Bannister, "Applications of Complex Image Theory," Radio Science, Vol. 21, No. 4 (Jul.-Aug. 1986) which is incorporated herein by reference.

Hence, new techniques for estimation of antenna gain under near-field conditions and in the presence of a lossy half-space are desirable.

SUMMARY OF INVENTION

A method and system are provided for estimating an antenna gain of an antenna under test (AUT) based on a signal emitted by the AUT and received by a probe antenna positioned within a near-field region of the AUT. The system includes an AUT to be measured, mounted over an air-sea interface on a first non-conductive mount, and the probe antenna, mounted over the air-sea interface on a second non-conductive mount within the near-field region of the AUT.

A receiver such as a spectrum analyzer is attached to the probe antenna. An electromagnetic signal may be generated from the AUT, and received at the probe antenna.

In conjunction with the near-field measurements, calculation based on complex image theory may be utilized in order to estimate the gain of the AUT in the far-field region of the AUT in the presence of a lossy half-space based on measurements of the electromagnetic field received at the probe antenna in the near-field region. Via complex image theory, calculation of a potential generated by the AUT in the presence of the lossy half-space is mathematically mapped to an equivalent problem of calculating the potential from the AUT and one or more "mirror image" emitter(s) directly below the AUT at potentially complex valued depths in free-space. The potential thus computed remains valid in both the near and far-field regions. In this way, use of complex image theory allows for calculation of the antenna gain of the AUT in the far-field region based on measurements of the electromagnetic field received at the probe antenna in the near-field region.

By utilizing near-field measurements of the AUT, space restrictions of the antenna range are circumvented. By utilizing complex image theory in the calculation of the antenna gain, the effect of the presence of a lossy half-space, such as the air-sea interface, on the antenna gain can be incorporated.

The effect of utilizing complex image theory in the calculation of the antenna gain is that the presence of the lossy half-space is taken into account in calculations of the antenna gain in the near-field region, allowing for a more compact antenna range for testing of the AUT. Additionally, due to the compactness of the antenna range for near-field testing, the signal-to-noise ratio is reduced.

BRIEF DESCRIPTION OF THE DRAWINGS

Features of illustrative embodiments may be understood from the accompanying drawings in conjunction with the description. The elements in the drawings may not be drawn to scale. Some elements and/or dimensions may be enlarged or minimized for the purpose of illustration and understanding of the disclosed embodiments wherein.

DETAILED DESCRIPTION OF THE INVENTION

The following description relates to an antenna range, including an antenna under test (AUT) and a probe antenna, for the measurement of a gain of the AUT.

Figure 1:
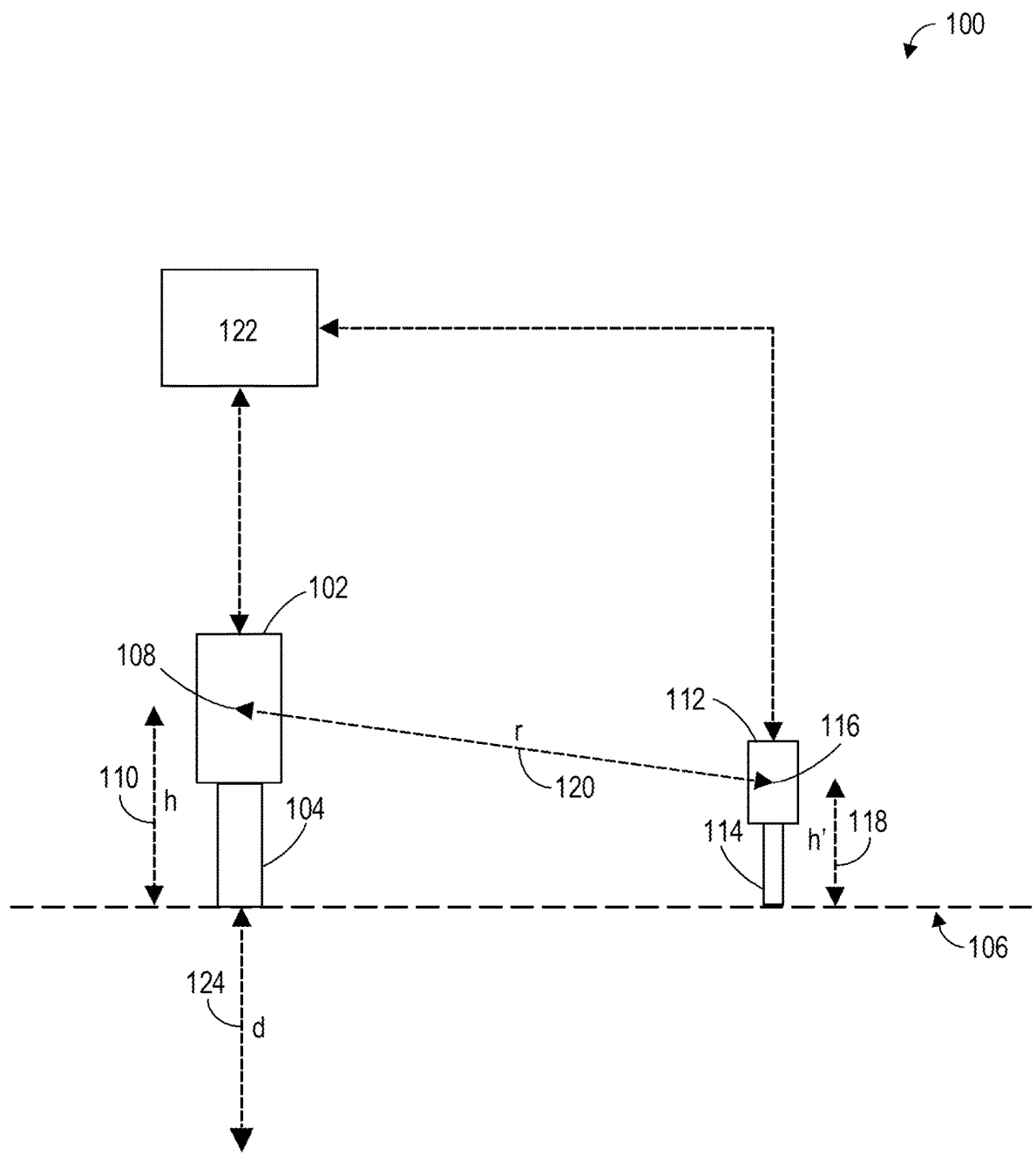
FIG. 1 is a schematic view of an antenna range including an antenna under test (AUT) and a probe antenna.
Figure 2:
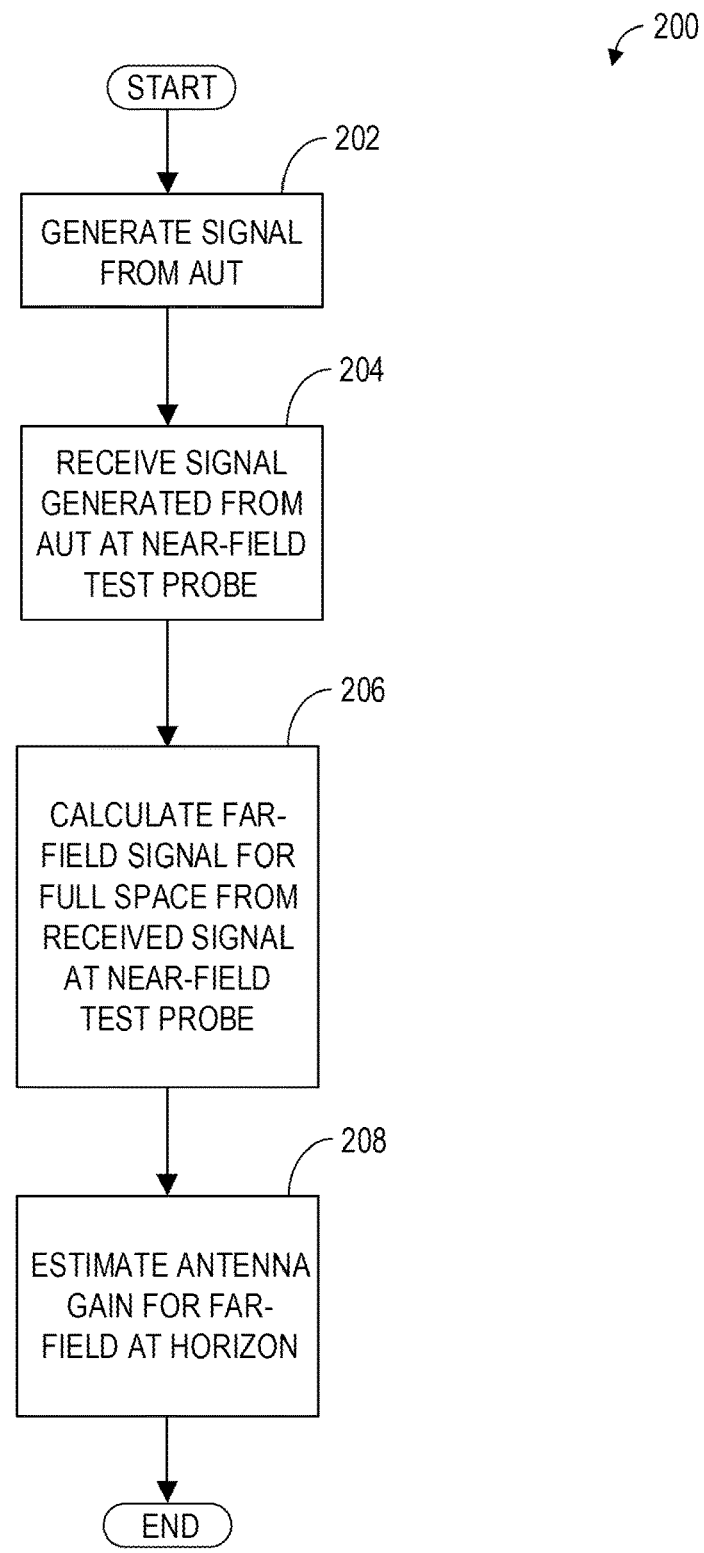
FIG. 2 is an example method for estimating the antenna gain of the AUT via near-field measurements and calculation via complex image theory.

The antenna range, including the antenna under test (AUT) and the probe antenna, is shown in FIG. 1. An example method for estimating an antenna gain of the AUT via measurement of near-field signals at the probe antenna and calculation via complex image theory is shown in FIG. 2.

FIG. 1 depicts an antenna range 100 for measuring properties of the AUT 102. The AUT 102 is any of several types of antenna common in the art, including but not limited to, a loop antenna, a resonant monopole antenna, etc. The AUT 102 is mounted on top of a first mount 104 directly above an air-sea interface 106. The first mount 104 is made of a non-conducting, non-water absorbing material, such as plastic, so as to not affect a current distribution of the AUT 102. Any effect on the current distribution of the AUT 102 can affect transmission and reception of signals at the AUT 102. The first mount 104 may be positioned above the air-sea interface 106. A first phase center 108 of the AUT 102 is at a first height h (as denoted by line 110) above the air-sea interface. Height h should be chosen to position AUT 102 electrically near the interface. This means less than one wavelength at the test frequency. Height h can also be governed by the size of the surface being used to simulate the air-sea interface. Height h should be less than one fourth of the minimum distance to the edge of the surface.

The antenna range 100 also includes a probe antenna 112. The probe antenna in one example may be similar to the AUT 102, and in other examples may be of a different design from the AUT 102. For example, the probe antenna 112 is any of several types of antenna common in the art, including, but not limited to a loop antenna, a resonant monopole antenna, etc. In the preferred embodiment the probe is of physical dimension much smaller than the shortest wavelength of operation. The probe antenna 112 is mounted to a second mount 114 above the air-sea interface 106. In this way, each of the AUT 102 and the probe antenna 112 are mounted on distinct mounts positioned over the air-sea interface 106. The probe antenna 112 is placed a first distance from the AUT 102, the first distance expressible in terms of other distances described herein. A second phase center 116 of the probe antenna 112 is at a second height h' (as denoted by line 118) above the air-sea interface 106. Similarly to the first mount 104, the second mount 114 is made of a non-conducting, non-water absorbing material, such as plastic, as to not affect a current distribution of the probe antenna 112. The height h' should be small such that:

$$\lambda \gg h' \quad (2)$$

is obeyed, where $\lambda$ is the wavelength of the signal emitted by AUT 102. Additionally, the height h is greater than the height h'. In one example, the probe antenna 112 is an electrically small antenna, such as a short dipole or small loop antenna. (Electrically small means that the antenna length is much less than one wavelength.) The probe antenna 112 may be chosen as a small loop antenna so that the effect of the air-sea interface 106 is minimal, owing to the continuity of the magnetic flux density across the air-sea interface.

The first phase center 108 of the AUT 102 and the second phase center 116 of the probe antenna 112 are separated by a second distance r (as denoted by line 120). The second distance r is within a near-field region of the AUT 102. For example, the second distance r may be in a near-field region of the AUT 102, the near-field region being within 0.5 to 1 wavelengths of the electromagnetic signal emitted by the AUT 102.

The antenna range 100 further includes controller 122. Controller 122 may be powered through onboard stored energy via a battery (not shown). Controller 122 may be configured as a conventional microcomputer including a microprocessor unit, input/output ports, read-only memory, random access memory, keep alive memory, a controller area network (CAN) bus, etc. The controller 122 receives input data from the various sensors, processes the input data, and triggers actuators in response to the processed input data based on instructions or code programmed therein corresponding to one or more routines. For example, controller 122 may be a network analyzer electrically coupled to each of the AUT 102 and the probe antenna 112, acting as an RF signal source and a receiver. In this way, the controller 122 may cause the AUT 102 to emit a signal of electromagnetic radiation at the wavelength $\lambda$, and may process data of the signal in response to the signal being received at the probe antenna 112, including processing data of the received signal via complex image theory. A method for calculating antenna gain of the AUT 102 by controller 122 via measurements received at the probe antenna 112 is described in FIG. 2.

Using complex image theory, signals from AUT 102 measured at the probe antenna 112 that are in the near-field and in the presence of a lossy half-space, such as the air-sea interface 106, are used to calculate the antenna gain of AUT 102 in the far-field at the horizon. In particular, the problem of calculating a potential generated by the AUT 102 in the presence of a lossy half-space can be mathematically mapped via complex image theory onto an equivalent problem of calculating the potential in free-space generated by both the AUT 102 and a plurality of "mirror image" emitters (also referred to herein as a mirror emitters) directly beneath the AUT 102. In particular, in an example of low frequency operation by the AUT 102 (e.g., approximately 30 MHz for operation over seawater), a single mirror emitter is directly beneath the first phase center 108 a distance d (denoted by line 124 of FIG. 1) beneath the surface of the air-sea interface 106, where d is calculated based on equation (3):

$$d = h + \delta(1-j) \quad (3)$$

where $\delta$ is the skin depth of the ocean at the wavelength of operation, and j is the imaginary unit (this formulation assumes a time variation of $\exp(j\omega t)$, as is customary in electrical science). In this way, the distance of the mirror emitter of the AUT from the interface is estimated as a function of the first height h of the first phase center 108 from the air-sea interface 106, and a skin depth $\delta$ of a water body at the air-sea interface 106, the skin depth being a function of the wavelength of the signal received by the probe antenna 112.

At frequencies above this low frequency band (>30 MHz) of the AUT 102, a plurality of complex images appear at a regular spacing directly beneath the AUT 102 at a distance $d_n$ from the air-sea interface 106, where $d_n$ is calculated based on equation (4):

$$d_n = h + n d_0 \quad (4)$$

where $d_0$ is a complex valued base distance, the image locations are determined in such a manner that the electrical field boundary conditions at the air-sea interface 106 are satisfied.

In this way, the system described in FIG. 1 illustrates a system for the AUT 102. This system includes the AUT 102 coupled to a first mount 104 positioned directly above the air-sea interface 106. The probe antenna 112 is coupled to the second mount 114 positioned directly above the air-sea interface 106. The probe antenna 112 is separated by the first distance from the AUT 102 within a near-field region of the AUT 102. The controller 122 has executable instructions stored in a non-transitory memory. These instructions cause the controller 122 to estimate an antenna gain of the AUT 102 within a far-field region of the AUT 102 based on an electromagnetic signal emitted by the AUT 102 and received by the probe antenna 112 using complex image theory.

FIG. 2 shows a method 200 for operating an antenna range (such as antenna range 100 of FIG. 1) for determining the antenna gain of an AUT (such as AUT 102 of FIG. 1) in the presence of an air-sea interface (such as air-sea interface 106 of FIG. 1). Method 200 and all other methods described herein will be described in reference to the systems described herein and with regard to FIG. 1, but it should be understood that similar methods may be applied to other systems without departing from the scope of this disclosure. Method 200 may be carried out by controller 122, and may be stored in non-transitory memory. Instructions for carrying out method 200 may be executed by the controller conjunction with signals received from the antenna range 100.

At 202, method 200 includes generating a known signal from the AUT of the antenna range. Known signal should have a known electromagnetic power level. The signal generated from the AUT can be an electromagnetic signal of a given radio frequency, or can be an electromagnetic signal composed of several frequencies within a given radio frequency band. For example, the signal may be generated at a single low frequency (e.g., at or below 30 MHz above seawater). In another example, the frequency generated by the AUT is composed of one or more frequencies within the high frequency (HF) radio band, which is defined as the frequency band ranging from 2-30 MHz. The signal generated by the AUT is in response to the controller, which acts as a radio transmitter.

At 204, method 200 includes receiving the signal generated from the AUT by a probe antenna (such as probe antenna 112 of FIG. 1) of the antenna range. The signal received at the probe antenna includes a near-field signal of electromagnetic fields emitted by the AUT in the presence of the lossy half-space, e.g., the air-sea interface. Upon receiving the signal from the AUT, the probe antenna then transmits the received signal to the controller. In one example, the controller performs analog to digital (A/D) conversion, and also calibrates out losses introduced by cables and connectors used to connect the controller to the AUT and probe antenna.

At 206, method 200 includes calculating a far-field signal in a full three-dimensional space (e.g., without the presence of a lossy half-space, such as the air-sea interface 106 of FIG. 1) from the received signal at the probe antenna via complex image theory. Using complex image theory, the problem of calculating the potential generated by the AUT in the presence of the lossy half-space is mathematically mapped to an equivalent problem of calculating the potential from the AUT and a mirror emitter directly below the AUT in free-space, the potential valid in both the near and far-field ranges. For example, the signal received at the probe antenna may be a low frequency signal at 30 MHz, whereby the approximation of a single mirror emitter at a distance d directly below the air-sea interface may be valid. In this example, a normalized potential A at the horizon is calculated using equation (5):

$$A(\theta = 0) \approx \frac{\mu_0}{4\pi} \frac{e^{-jk_0\rho}}{\rho}\left(1 + e^{-jk_0 \frac{2dh+d^2}{\rho}}\right) \quad (5)$$

where $\mu_0$ is the vacuum permeability, $k_0$ is the wavenumber corresponding to the wavelength $\lambda$, $\rho$ is a third distance of a point defined on the air-sea interface from the position of the AUT on the air-sea interface, and $\theta=0$ defines the plane of the horizon (which coincides with the air-sea interface). The normalized potential is calculated via the controller based on estimated values of the parameters $k_0$, h, and d. In one example, the potential can be represented in the controller as a mathematical function of $\rho$ stored in the memory of the controller. In another example, the normalized potential can be a look-up table for different values of the third distance $\rho$ stored in the memory of the controller. The normalized potential given above is shown as a function of the third distance $\rho$, and is valid within both the near-field and far-field ranges. If the frequency of operation of the AUT is not in the low-frequency range, where the approximation of a single mirror emitter in addition to the AUT is valid, then a more complicated form for the potential can be calculated by the controller, based on the mathematical problem of n mirror emitters placed directly below the AUT, spaced at distances $d_n$ below the air-sea interface, where the equation for $d_n$ is shown in (4).

At 208, method 200 includes estimating the antenna gain in the far-field range at the horizon (the horizon corresponding to $\theta=0$). The antenna gain can be estimated at the third distance $\rho$ from the AUT via estimation of the normalized potential of the AUT as in 206. Based on the near-field measurements of the electric field received at the probe antenna in 204, the controller can then use (5) to extrapolate the value of the electric field of the AUT in the far-field, which can then be utilized to estimate the antenna gain in the far-field. The conversions from the normalized potential (5) to the electric field to the antenna gain in the far-field at the horizon can be done via the controller, either via mathematical functions stored in the memory of the controller, or via one or more look-up tables stored in the memory of the controller. Following estimation of the far-field antenna gain at the horizon by the controller, the method ends.

In this way, the method 200 of FIG. 2 comprises a method for generating an electromagnetic signal from the AUT, receiving the electromagnetic signal generated from the AUT at a probe antenna in a lossy half-space, and estimating an antenna gain of the AUT within a far-field region of the AUT based on the received signal. By estimating the normalized potential generated by the AUT via complex image theory and utilizing near-field measurements of the electric field generated by the AUT via the probe antenna, a far-field antenna gain of the AUT at the horizon may be estimated. By utilizing complex image theory, the antenna range may be utilized for near-field measurements, allowing for a smaller distance between the AUT and the probe range of the antenna range.

The technical effects of utilizing complex image theory and near-field measurements to estimate the far-field gain of the AUT are that a smaller distance of the antenna range allows for a better signal-to-noise ratio during data collection, a more compact antenna range for ease of testing, and a reduction of susceptibility to interference from outside signals that may occur more frequently in far-field antenna range set ups. Due to the reduced signal-to-noise ratio, the measurement process takes less time, due to the reduced number of measurements needed in order to average out noise, which in turn reduces time and labor costs associated with the measurement. Additionally, while the near-field measurements described in method 200 of FIG. 2 are with respect to an air-sea interface, other lossy half-spaces within the frequency range where complex image theory is applicable may be utilized. For example, the method may be utilized for a saltwater pool of sufficient depth in an indoor environment whose walls are coated in a radio frequency absorbing material as is done in the design of anechoic chambers for free-space measurements.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A method for estimating an antenna gain comprising:
   providing an antenna under test having a first phase center, said antenna under test being positioned near an environmental lossy half-space boundary;
   providing a probe antenna having a second phase center, said probe antenna being provided at a test distance of the antenna under test near the environmental lossy half-space boundary;
   emitting a known electromagnetic signal from the antenna under test;
   receiving the emitted known electromagnetic signal at the probe antenna;
   measuring an electric field of the received known electromagnetic signal;
   calculating a normalized potential at the lossy half-space boundary as a function of distance from the antenna under test; and
   estimating the antenna gain for the antenna under test at any distance from the antenna under test using the emitted known electromagnetic signal, the normalized potential, and the measured electric field.

2. The method in accordance with claim 1, wherein:
   the test distance is in the near-field of the antenna under test; and
   the estimated antenna gain of the antenna under test is estimated at a distance in a far-field region of the antenna under test.

3. The method in accordance with claim 1, wherein the known electromagnetic signal emitted by the antenna under test includes an electromagnetic signal emitted by the antenna under test at frequency below 30 MHz.

4. The method in accordance with claim 1, wherein:
   the step of providing an antenna under test includes mounting the antenna under test with the first phase center being a first distance above the environmental lossy half-space boundary; and
   the step of providing a probe antenna includes mounting the probe antenna with the second phase center being a second distance above the environmental lossy half-space boundary.

5. The method in accordance with claim 4, wherein the antenna under test includes a first phase center and the probe antenna includes a second phase center, the first phase center and the second phase center separated by a third distance.

6. The method in accordance with claim 5, further comprising calculating a distance of a mirror emitter of the antenna under test from the lossy half-space boundary utilizing the known electromagnetic signal, the first distance, and a skin depth of the lossy half-space boundary.

7. The method in accordance with claim 6, wherein the normalized potential is calculated utilizing the lossy half-space properties, a wave number of the received known electromagnetic signal, the first distance, and the calculated distance of a mirror emitter of the antenna under test from the lossy half-space boundary.

8. The method in accordance with claim 4, wherein the second distance is less than one half of a wavelength of the received electromagnetic signal, and the first distance is greater than the second distance.

9. The method in accordance with claim 1, further comprising accounting for losses introduced by cables and connectors in the estimated antenna gain.

10. A system for measuring gain for an antenna under test comprising:
    a lossy half-space boundary;
    a first mount for mounting a phase center of the antenna under test a first distance directly above said lossy half-space boundary;
    a second mount positioned a test distance horizontally from said first mount;
    a probe antenna positioned on said second mount with the probe antenna phase center a second distance directly above said lossy half-space boundary; and
    a controller joined to said probe antenna to receive a signal from said probe antenna and joinable to the antenna under test to provide a known signal to the antenna under test, said controller calculating electromagnetic signal parameters from the signal received from said probe antenna.

11. The apparatus of claim 10, wherein the test distance is within a near-field distance of the antenna under test.

12. The apparatus of claim 11, wherein the second distance is less than one half of a wavelength of the known signal, and the first distance is greater than the second distance.

13. The apparatus of claim 12, wherein said controller includes executable instructions stored in a non-transitory memory that cause said controller to estimate an antenna gain of the antenna under test within a far-field region of the antenna under test based on the known signal, and the received signal.

14. The apparatus of claim 10, wherein said probe antenna is an electrically small antenna.

15. The apparatus of claim 10, wherein said lossy half-space boundary is an air and saltwater boundary.

* * * * *